United States Patent
Tournadre

(10) Patent No.: US 6,552,913 B2
(45) Date of Patent: Apr. 22, 2003

(54) RETAINING DEVICE

(75) Inventor: Vincent Tournadre, Meylan (FR)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/996,111

(22) Filed: Nov. 27, 2001

(65) Prior Publication Data

US 2003/0035274 A1 Feb. 20, 2003

(30) Foreign Application Priority Data

Aug. 14, 2001 (EP) ............................................. 01410104

(51) Int. Cl.⁷ .................................................. H05K 5/04
(52) U.S. Cl. ........................ 361/759; 361/801; 361/802; 174/51
(58) Field of Search .................................. 361/759, 752, 361/740, 732, 726, 686, 818, 801, 802; 174/35 R, 51

(56) References Cited

U.S. PATENT DOCUMENTS

| 5,317,483 | A | * | 5/1994 | Swindler | 361/752 |
| 5,947,571 | A | * | 9/1999 | Ho | 312/223.2 |
| 5,967,466 | A | * | 10/1999 | Osborne et al. | 248/27.1 |
| 6,138,839 | A | * | 10/2000 | Cranston et al. | 211/41.17 |
| 6,231,139 | B1 | * | 5/2001 | Chen | 312/223.2 |

* cited by examiner

Primary Examiner—David Martin
Assistant Examiner—Hung Bui

(57) ABSTRACT

A retaining device for a card slot assembly, the retaining device comprising;
 a retaining portion,
 a connection element operable to permit angular movement of the retaining portion between an opened position and a closed position, and
 a releasable locking element operable to maintain the retaining portion in a closed position.

16 Claims, 2 Drawing Sheets

RETAINING DEVICE

DESCRIPTION OF INVENTION

This invention relates to a retaining device for a card slot assembly, and to a card slot assembly, particularly but not exclusively for provision as part of a personal computer chassis

BACKGROUND TO THE INVENTION

To enable a computer, particularly a personal computer, to be provided with additional cards to perform desired functions, it is known to provide the computer chassis with a card slot assembly. The card slot assembly conventionally comprises a plurality of generally parallel slots each of which receive one end of a card, to provide an external connection for the card and to physically hold one end of the card in place. Where a slot is not in use, a cover plate provided which closes the slot and which is attached to the card slot assembly, to prevent the ingress of dirt and other foreign bodies into the computer case.

To hold the card in place relative to the card slot assembly, it is necessary to provide some kind of retaining device. It is known to provide a threaded hole corresponding to each slot in the card slot assembly, such that a small screw may be passed through a suitable aperture in the card and received in the threaded hole in the card slot assembly. This permits individual cards and cover plates to be installed or removed, but the process of attempting to screw or unscrew the card or cover plate is awkward. It is further known to use a locking bar which clips in place across the top of some or all of the slots of the card slot assembly. To remove or install a card or cover plate, the locking bar is physically detached from the card slot assembly. In practice however, the locking bar is often difficult to correctly remove and replace, and might inadvertently be dropped onto other components of the computer with a resulting risk of damage.

An aim of the invention is to provide a new or improved retaining device for an expansion card slot assembly.

SUMMARY OF THE INVENTION

According to a first aspect of the invention, we provide a retaining device for a card slot assembly, the retaining device comprising a retaining portion, a connection element operable to permit angular movement of the retaining portion between an opened position and a closed position, and a releasable locking element operable to maintain the retaining portion in the closed position.

The connection element may comprise a pivotal connection.

The connection element may be adapted to engage a connection part of the card slot assembly to provide said pivotal connection.

The retaining device may comprise a manually engagable part which may be operable to release the locking element.

The locking element may be adapted to engage a locking part of the card slot assembly.

The retaining device portion may comprise a cover plate engaging part.

According to a second aspect of the invention, we provide an card slot assembly, the card slot assembly comprising a plurality of slots each adapted to receive a card, a connection part to receive a connection element of a retaining device, and a locking part adapted to engage a locking element of a retaining device.

The card slot assembly may be provided with a retaining device according to the first aspect of the invention.

BRIEF SUMMARY OF THE DRAWINGS

The invention will now be described byway of example only with reference o the accompanying drawings, wherein.

DESCRIPTION OF THE PREFERRED EMBODIMENTS

Figure 1:
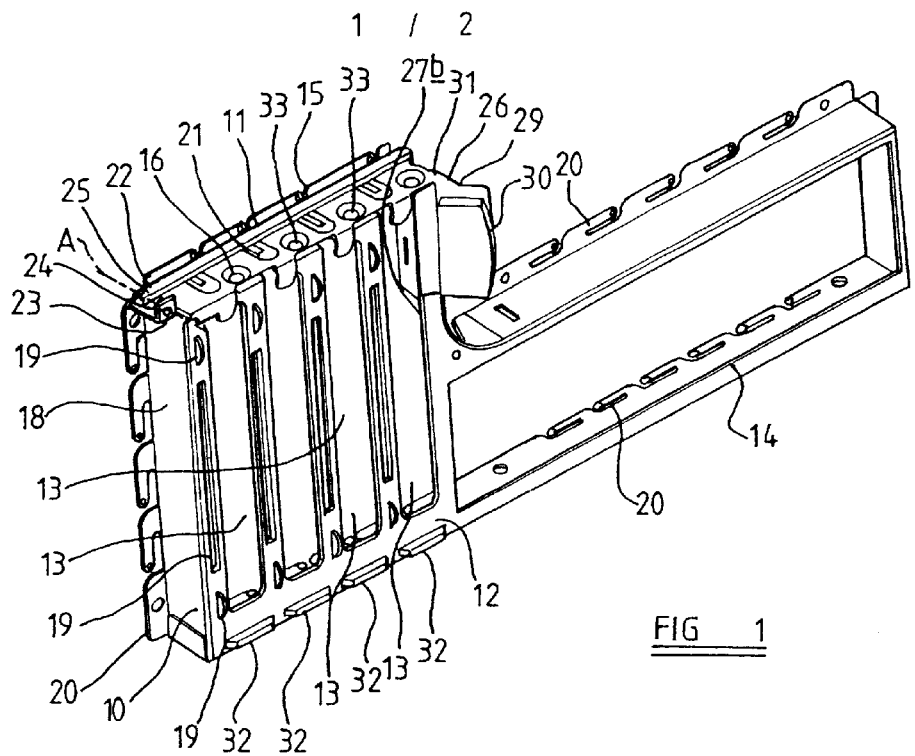
FIG. 1 is a perspective view of a card slot assembly and retaining device embodying the present invention.

Referring to the Figures, a card slot assembly is shown at 10 provided with a retaining device 11 embodying the present invention. The card slot assembly 10 comprises a first part 12 in which a plurality of generally parallel card slots 13 are provided, and a second part 14 of smaller height than the first part 12 and attached extending therefrom as seen in the Figures. The first part 13 comprises a rear wall 15, an upper wall 16, a first side wall 17 attached to the side of the rear wall 15 adjacent the second part 14, and a second side wall 18 attached to the rear wall 15 at a side thereof distant from the second part 14. Each slot 13 is provided in the rear wall 15, and comprises an open mouth 13a at an upper end thereof defined by a corresponding recess 13b extending into the upper wall 16 inwardly of each slot 13. The rear wall 15 is further provided with a plurality of abutment parts 19 in conventional manner to assist the location of cards or cover plates in the slots 13 as appropriate. The card slot assembly 10 is further provided with a plurality of attachment arms 20 to enable the card slot assembly 10 to be attached to a computer case or chassis as desired.

The retaining device 11 comprises a generally elongate portion 21 and a connection element 22 provided at one end of the elongate portion 21. In the present example, the connection element 22 comprises an elongate pin 23 attached to the elongate portion 21 extending in a direction generally transverse to the elongate portion 21. The pin 23 is received in an attachment part of the card slot assembly 10 comprising an upstanding lug 24 provided with an aperture 25 which is shaped to receive the pin 23. The engagement of the pin 23 in the aperture 25 thus permits angular movement of the retaining device 11 about an axis A, in this example defined by a longitudinal axis of the pin 23, but resists detachment of the retaining device 11 from the assembly 10.

At the end of the retaining portion distant from the connection element 22, the retaining device 11 is provided with a releasable locking element 26. The releasable locking element 26 comprises a first part 27a which is attached to the retaining portion 21 at an end thereof and extends transversely thereto, and a second part comprising a lug 27b extending transversely to the first part 27a. The length of the retaining portion 21 is such that when the retaining portion 21 is adjacent to the upper wall 16, the first part 27a extends generally alongside the first side wall 17 and the lug 27b is received in a locking part comprising an aperture 28 provided in the first side wall 17. In this example the retaining device 11 is constructed of a suitable material such that it is able to flex or permit the lug 27b to be received in and released from the aperture 28, but other releasable locking means may be provided if desired.

Attached to the first part 27a is a manually operable part comprising an ergonomic handle 29 at an end of the first part 27a adjacent the lug 27b. The handle 29 comprises a projecting graspable part 30 and a transversely extending flange part 31 attached to the first part 27a.

The assembly 10 further comprises a cover plate support 32 disposed below each slot 13 to receive a lower part of a cover plate, and the retaining portion 11 is provided with a plurality of cover plate engaging parts 33, such that when the retaining device 11 is in its closed position as shown in FIG. 1, each cover plate engaging part 33 lies generally alongside a corresponding slot 13.

Figure 3:
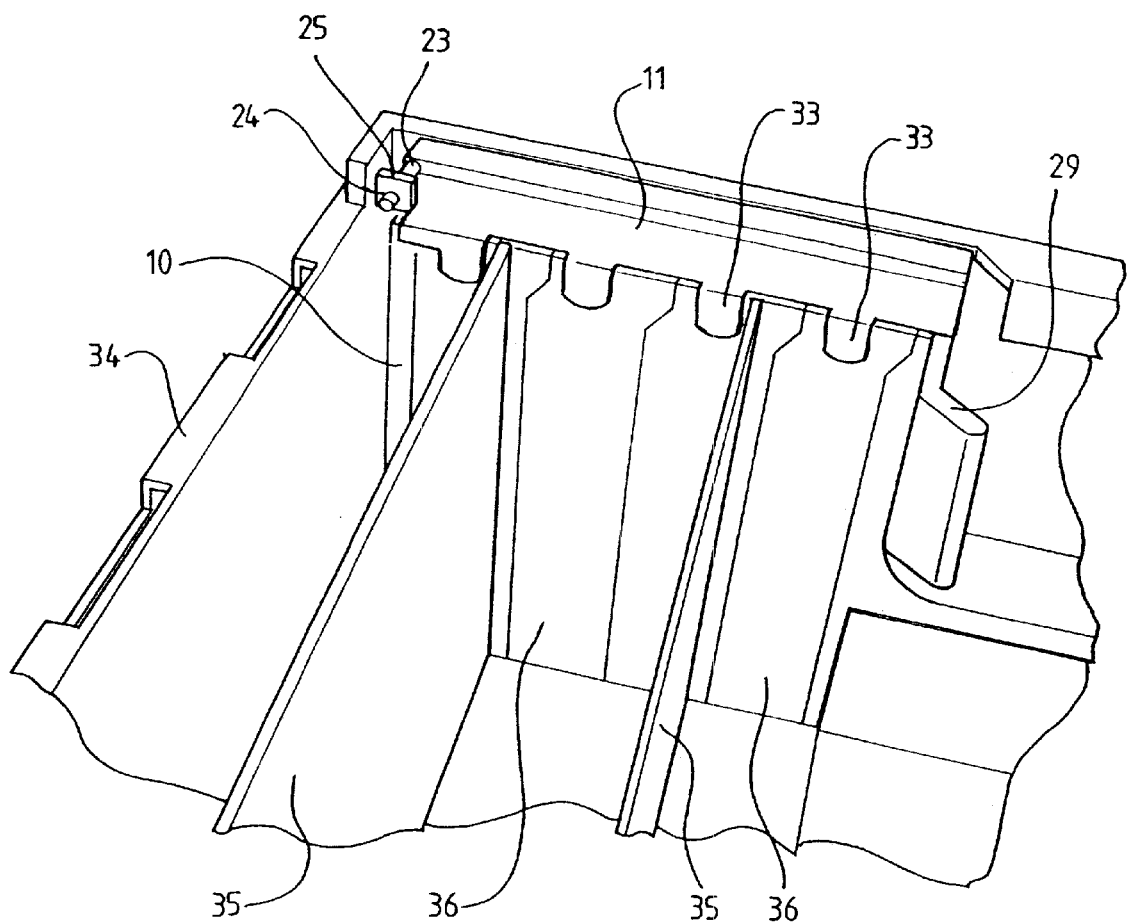
FIG. 3 is a perspective view of part of the card slot assembly and retaining device of FIGS. 1 and 2 located in a computer.

As shown in FIG. 3, a card slot assembly 10 and retaining device 11 are shown mounted in an operating position within a computer case 34. In the present example, it will be apparent that the first and third slots from the left are provided with cards 35, whilst the second and fourth slots from the left are provided with appropriate cover plates 36. In FIG. 3, the retaining device is shown in its closed position of FIG. 1, such that the lug 27 is received in the slot 28 of the side wall 17. The cover plate engaging parts 33 of the second and fourth slots lie alongside the corresponding cover plate 36, thus preventing withdrawal of the respective cover plate 36. The retaining portion 21 closes the mouths 13a of each slot 13 and engages the upper end of each board 35, thus maintaining each board 35 in place relative to the card slot assembly 10.

Figure 2:
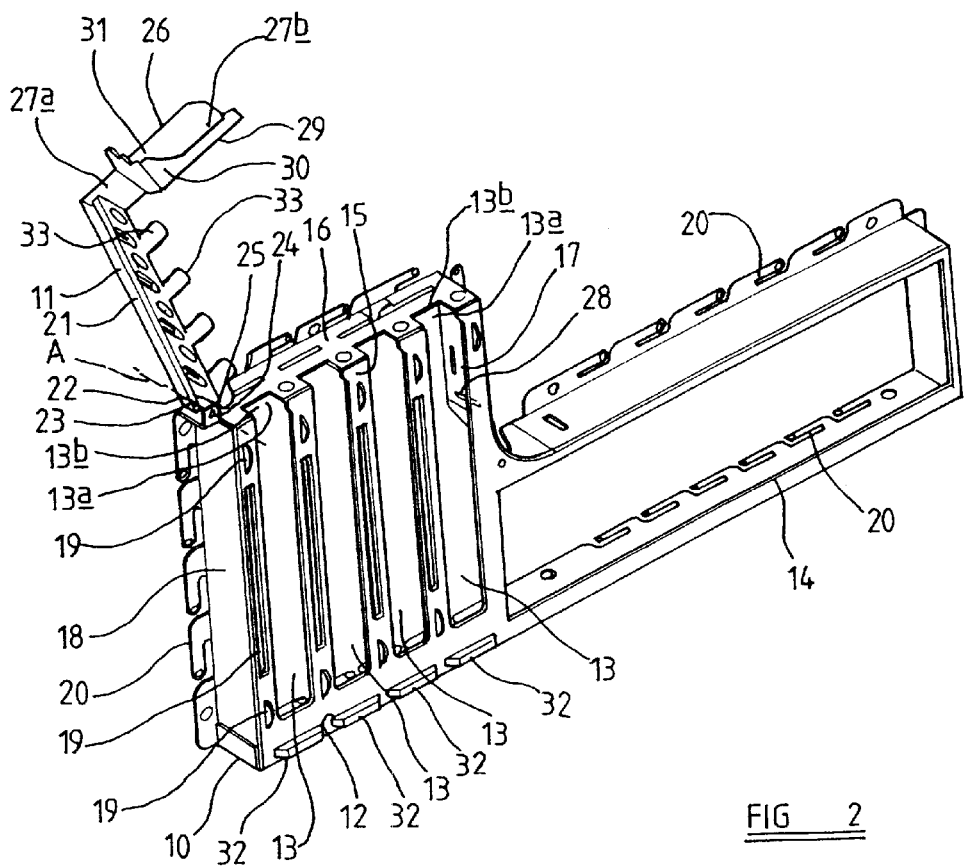
FIG. 2 is a further perspective view of the card slot assembly and retaining device of FIG. 1.

When it is desired to remove or install a board 35, a user pulls the handle 29 to release the lug 27 from the aperture 28 thus releasing the locking element 26, and rotate the locking device 11 about the axis A until it reaches its open position as shown in FIG. 2. A card may then be introduced or removed from a corresponding slot 13 in a generally vertical direction as seen in the Figures, passing through the mouth 13a of the slot 13. A cover plate 36 may be removed, or may be inserted to cover a slot 13 by locating a lower part of the cover plate in a cover plate support 32 as needed. Once the necessary changes have been made, for example a new card 35 is correctly in place, the retaining device 11 may be rotated to its closed position as shown in FIG. 1 such that the lug 27 reengages the aperture 28 to hold the retaining device 11 in its closed portion and engage the boards 35 and cover plates 36 mounted on the assembly 10.

It will thus be apparent that the present invention permits the simple introduction and removal of cards and/or cover plates to or from a card slot assembly as desired, without the necessity for having to remove and replace screws, and without needing to physically detach the retaining means 11 from the assembly 10. Although the card slot assembly 10 shown in the present example has four slots it will be apparent that the assembly 10 may comprise any number of slots as desired.

In the present specification "comprises" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed is:

1. A retaining device for a card slot assembly, the retaining device comprising:
   a retaining portion;
   a connection element operable to permit angular movement of the retaining portion between an opened position and a closed position; and
   a releasable locking element operable to maintain the retaining portion in the closed position, wherein the locking element comprises
      a first part attached to the retaining portion at an end thereof and extending traversely thereto;
      a second part having a lug extending transversely to the first part such that when the retaining portion is in the closed position the lug is received in a locking part of the card slot assembly; and
      a manually engagable part shaped and dimensioned to be grasped by a user and moved to operate the first part and the second part.

2. A retaining device according to claim 1 wherein the connection element comprises a pivotal connection.

3. A retaining device according to claim 2 wherein the connection element is adapted to engage a connection part of the card slot assembly to provide said pivotal connection.

4. A retaining device according to claim 1 wherein the retaining portion comprises a cover plate engaging part.

5. A retaining device according to claim 1, wherein both the first part and the second part are perpendicular to the retaining portion.

6. A retaining device according to claim 1, wherein the first part is perpendicular to the second part.

7. A retaining device according to claim 1, wherein the manually engagable part is perpendicular to the retaining portion and rotatable around an axis in perpendicular to the retaining portion.

8. A retaining device according to claim 1, wherein the manually engagable part is adapted to be engaged in an aperture of a side wall of the card slot assembly to lock the retaining device to the card slot assembly.

9. An expansion card slot assembly, comprising a plurality of slots each adapted to receive a card, a connection part adapted to receive a connection element of a retaining device, and a locking part adapted to engage with a releasable locking element of a retaining device, said locking element operable to maintain the retaining device in the closed position, the locking element comprising
   a first part attached to a retaining portion at an end thereof and extending transversely thereto; and
   a second part having a lug extending transversely to the first part, the locking part further adapted such that when the retaining portion is in the closed position the lug is received in the locking part, wherein the locking part is further adapted so that the locking element is operable by means of a manually engagable part located on the locking element.

10. A card slot assembly according to claim 9 provided with a retaining device having a retaining portion, and a connection element operable to permit angular movement of the retaining portion between an opened position and a closed position.

11. A card slot assembly according to claim 10 wherein the connection element comprises a pivotal connection.

12. A card slot assembly according to claim 10 comprising a manually engagable part operable to release the locking element.

13. A card slot assembly according to claim 10 wherein the locking element is adapted to engage a locking part of the card slot assembly.

14. A card slot assembly according to claim 10 wherein the retaining portion comprises a cover plate engaging part.

15. A retaining device for securing circuit cards into a card slot assembly, comprising:

a retaining portion with one end rotatably fixed to the card slot assembly;

a vertical portion fixed to the other end of the retaining portion, said vertical portion being perpendicular to the retaining portion; and an engaging portion rotatably fixed to the vertical portion, the engaging portion being rotatable around an axis in perpendicular to the retaining portion, wherein in a closed position the engaging portion is engaged in an aperture of a side wall of the card slot assembly to lock the retaining device to the card slot assembly.

16. A retaining device according to claim 15, wherein the vertical portion comprises a first part and a second part in perpendicular to the first part.

* * * * *